(12) United States Patent  
Maeto

(10) Patent No.: US 9,105,301 B2  
(45) Date of Patent: Aug. 11, 2015

(54) SIGNAL PROCESSING APPARATUS, SIGNAL PROCESSING METHOD, AND MAGNETIC DISK APPARATUS

(75) Inventor: Nobuhiro Maeto, Nishitama-gun (JP)

(73) Assignee: Kabushiki Kaisha Toshiba, Tokyo (JP)

(*) Notice: Subject to any disclaimer, the term of this patent is extended or adjusted under 35 U.S.C. 154(b) by 85 days.

(21) Appl. No.: 13/559,947

(22) Filed: Jul. 27, 2012

(65) Prior Publication Data

US 2013/0182347 A1  Jul. 18, 2013

(30) Foreign Application Priority Data

Jan. 18, 2012  (JP) .................................. 2012-007935

(51) Int. Cl.
- *G11B 5/035* (2006.01)
- *G11B 20/10* (2006.01)
- *H03M 13/41* (2006.01)
- *H03M 13/00* (2006.01)

(52) U.S. Cl.
CPC .......... *G11B 20/10* (2013.01); *G11B 20/10009* (2013.01); *G11B 20/10037* (2013.01); *G11B 20/10046* (2013.01); *G11B 20/10268* (2013.01); *G11B 20/10296* (2013.01); *H03M 13/4107* (2013.01); *H03M 13/4138* (2013.01); *H03M 13/6577* (2013.01); *G11B 2220/2508* (2013.01)

(58) Field of Classification Search
None
See application file for complete search history.

(56) References Cited

U.S. PATENT DOCUMENTS

| | | | |
|---|---|---|---|
| 5,422,760 A | 6/1995 | Abbott et al. | |
| 7,076,006 B2 | 7/2006 | Fujiwara et al. | |
| 7,430,084 B2* | 9/2008 | Eleftheriou et al. | 360/46 |
| 7,495,854 B2* | 2/2009 | Hutchins et al. | 360/46 |
| 7,511,910 B1* | 3/2009 | Han | 360/65 |
| 8,261,171 B2* | 9/2012 | Annampedu | 714/795 |
| 8,291,304 B2* | 10/2012 | Yoshida et al. | 714/795 |
| 8,477,447 B1* | 7/2013 | Han | 360/65 |
| 8,854,753 B2* | 10/2014 | Tan et al. | 360/39 |
| 2007/0211833 A1* | 9/2007 | Lee et al. | 375/341 |
| 2008/0192378 A1* | 8/2008 | Bliss et al. | 360/69 |
| 2010/0287420 A1* | 11/2010 | Mathew et al. | 714/48 |
| 2011/0072335 A1* | 3/2011 | Liu et al. | 714/796 |
| 2012/0224277 A1* | 9/2012 | Steiner et al. | 360/32 |
| 2013/0051211 A1* | 2/2013 | Bailey et al. | 369/174 |

FOREIGN PATENT DOCUMENTS

| | | |
|---|---|---|
| JP | 07-182786 A | 7/1995 |
| JP | 11-355151 A | 12/1999 |
| JP | 3647761 B2 | 5/2005 |

* cited by examiner

*Primary Examiner* — Dismery Mercedes
(74) *Attorney, Agent, or Firm* — Knobbe Martens Olson & Bear LLP

(57) ABSTRACT

According to at least one embodiment, a signal processor apparatus includes a Viterbi decoder, a processor, and an adjustment module. The Viterbi decoder calculates a branch metric based on an input signal. The processor outputs a processing result correlated with a processing result of the Viterbi decoder. A latency of the processor for the input signal is lower than a latency of the Viterbi decoder. The adjustment module adjusts a first parameter for calculating the branch metric based on the processing result of the processor.

12 Claims, 5 Drawing Sheets

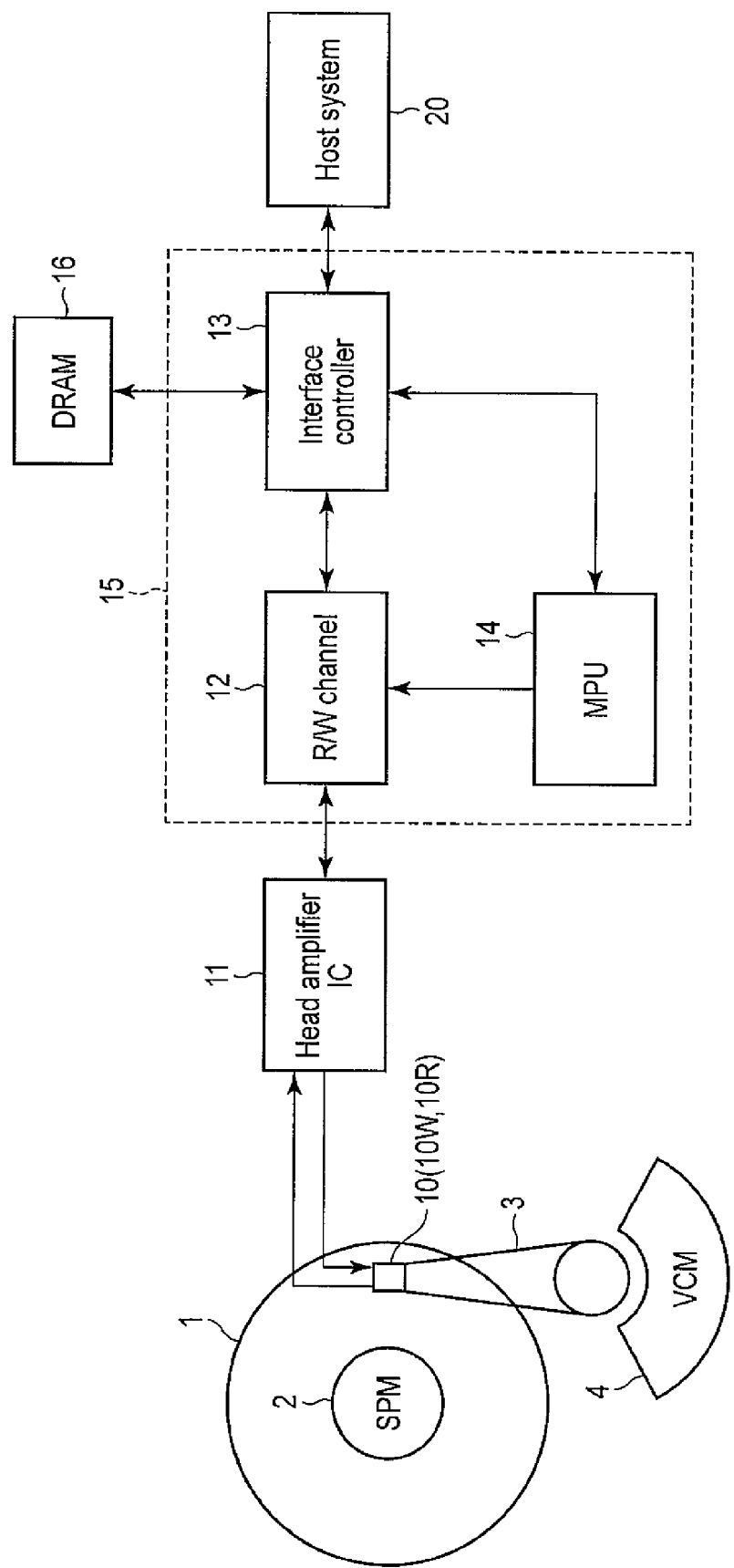
F I G. 1

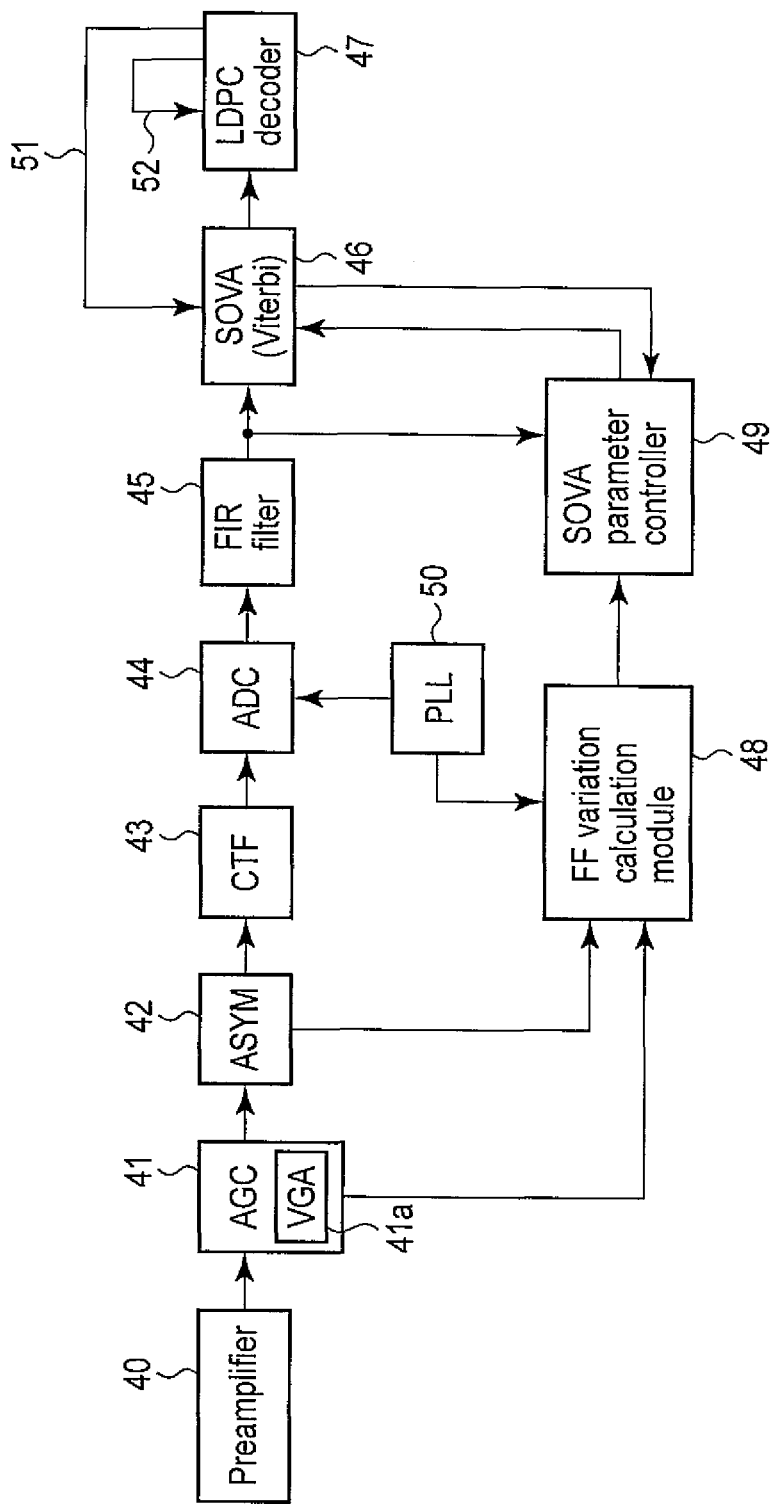
F I G. 2

SIGNAL PROCESSING APPARATUS, SIGNAL PROCESSING METHOD, AND MAGNETIC DISK APPARATUS

CROSS-REFERENCE TO RELATED APPLICATIONS

This application is based upon and claims the benefit of priority from prior Japanese Patent Application No. 2012-007935, filed Jan. 18, 2012, the entire contents of which are incorporated herein by reference.

FIELD

Embodiments described herein relate generally to a signal processing apparatus, a signal processing method, and a magnetic disk apparatus.

BACKGROUND

In recent years, a technique of increasing the recording density of a magnetic disk has been developed for a magnetic disk apparatus. Data to be recorded on the magnetic disk is encoded by an encoding algorithm having an error correcting capability.

Furthermore, as the density of the magnetic disk increases recently and/or the like, the necessity of considering the influence of noise included in a signal to be read by the read head of the magnetic disk apparatus is growing.

For example, because of the increase in the recording density of the magnetic disk, the degradation of the read head positioning accuracy, and the decrease in the width of a write head, the read head sometimes reads noise from an adjacent data track.

Even in one track, the S/N ratio may vary between the data sectors. A mismatch may occur between the optimization parameters of the read channel of the magnetic disk adjusted for each of data sectors and the optimization parameters to be applied to the data sector under the read. That is, adjustment is necessary for preventing, with real time, the variation of the S/N ratio for the data sector under the read from affecting the optimization parameters.

BRIEF DESCRIPTION OF THE DRAWINGS

FIG. 1 is an exemplary block diagram showing an example of a system arrangement of a magnetic disk apparatus according to an embodiment.

FIG. 2 is an exemplary block diagram showing an example of an arrangement of the read channel of the magnetic disk apparatus according to the embodiment.

DETAILED DESCRIPTION

Figure 3:
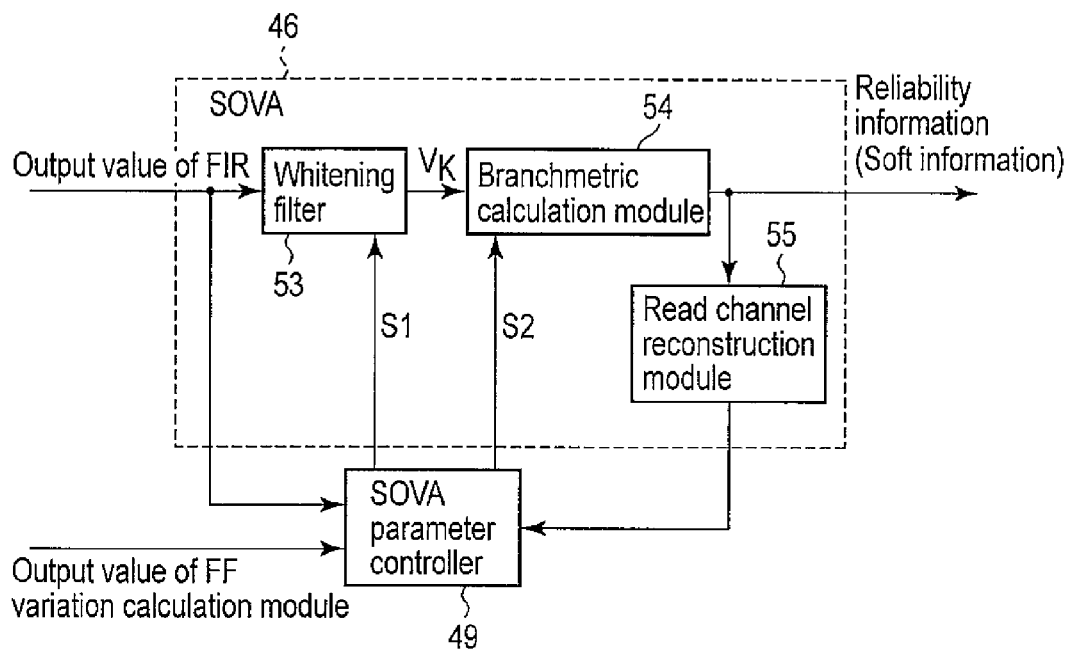
FIG. 3 is an exemplary block diagram showing an example of a system arrangement of a SOVA (Soft Output Viterbi Algorithm) of the magnetic disk apparatus according to the embodiment.

In general, according to one embodiment, a signal processing apparatus includes a Viterbi decoder, a processor, and an adjustment module. The Viterbi decoder calculates a branch metric based on an input signal. The processor outputs a processing result correlated with a processing result of the Viterbi decoder. A latency of the processor for the input signal is lower than a latency of the Viterbi decoder. The adjustment module adjusts a first parameter for calculating the branch metric based on the processing result of the processor.

Various embodiments will be described hereinafter with reference to the accompanying drawings.

FIG. 1 is a block diagram showing the main parts of a magnetic disk apparatus according to the embodiment.

As shown in FIG. 1, the magnetic disk apparatus is roughly divided into an HDA (Head-Disk Assembly), a head amplifier integrated circuit (to be referred to as a head amplifier IC hereinafter) 11, and an HDC (Hard Disk Controller) 15.

The HDA includes a magnetic disk 1 serving as a recording medium, a spindle motor (SPM) 2, an arm 3 having a head 10, and a voice coil motor (VCM) 4. The magnetic disk 1 is rotated by the spindle motor 2. The arm 3 and the VCM 4 form an actuator. The actuator is driven by the VCM 4 so as to control and move the head 10 mounted on the arm 3 to a designated position on the magnetic disk 1.

The head 10 is formed from a slider that is the main body, and includes a write head 10W and a read head 10R which are mounted on the slider. The read head 10R reads data (to be referred to as read data hereinafter) recorded on a data track of the magnetic disk 1 (to be referred to as "upon read" hereinafter). The write head 10W writes data (to be referred to as write data hereinafter) on the magnetic disk 1 (to be referred to as "upon write" hereinafter).

The head amplifier IC 11 includes a preamplifier and a write driver. The preamplifier amplifies the read signal (to be referred to as an input signal hereinafter) read by the read head 10R and transmits it to a read/write (R/W) channel 12. On the other hand, the write driver transmits a write current corresponding to write data output from the R/W channel 12 to the write head 10W.

The HDC 15 is formed from a 1-chip integrated circuit including the R/W channel 12, an interface controller 13, and a microprocessor (MPU) 14. The R/W channel 12 includes a read channel for executing signal processing of read data, and a write channel for executing signal processing of write data.

The interface controller 13 controls data transfer between a host system 20 and the R/W channel 12.

The MPU 14 is the main controller of the drive, which executes servo control to control the VCM 4 and position the head 10.

Details of the read channel function in the R/W channel 12 will be described next in detail with reference to the block diagram of FIG. 2.

The read channel includes a preamplifier 40, an AGC (Automatic Gain Controller) 41, an asymmetry correction module (ASYM) 42, a waveform equalizer (CTF) 43, an analog-to-digital converter (ADC) 44, an FIR filter 45, a soft output Viterbi algorithm (SOVA) decoder 46, a low-density parity-check (LDPC) decoder 47, a PLL (Phase Locked Loop) 50, a feed forward (FF) variation calculation module 48, a SOVA parameter controller 49, and the like. Note that the soft output Viterbi algorithm decoder 46 that is a maximum likelihood decoder will be abbreviated as a SOVA hereinafter.

The AGC 41 is connected to the preamplifier 40, the asymmetry correction module 42, and the FF variation calculation module 48. The AGC 41 comprises a VGA (Variable Gain Amplifier) 41a. The input signal amplified by the preamplifier 40 is input to the VGA 41a. The output result of the VGA 41a is sent to the FF variation calculation module 48.

The asymmetry correction module 42 is connected to the AGC 41, the waveform equalizer 43, and the FF variation calculation module 48. The asymmetry correction module 42 corrects the vertical asymmetrical distortion (asymmetry) of the input signal. The asymmetry correction amount is sent to the FF variation calculation module 48. The output value of the asymmetry correction module 42 is sent to the waveform equalizer 43.

The waveform equalizer 43 is connected to the asymmetry correction module 42 and the ADC 44. The waveform equalizer 43 is a low-pass filter which equalizes the waveform of the signal of the output result of the asymmetry correction module 42. The output result of the waveform equalizer 43 is output to the ADC 44.

The ADC 44 is connected to the waveform equalizer 43, the FIR filter 45, and the PLL 50. Using a phase synchronization signal from the PLL 50, the ADC 44 quantizes the analog signal, which has undergone the waveform equalization of the waveform equalizer 43, and converts the analog signal into a digital signal. The output signal of the ADC 44 is sent to the FIR filter 45.

The FIR filter 45 is connected to the ADC 44 and the SOVA 46. The FIR filter 45 equalizes the waveform of the digital signal output from the ADC 44. The output result of the FIR filter 45 is sent to the SOVA 46.

The SOVA 46 is a soft output Viterbi algorithm decoder which is connected to the FIR filter 45, the LDPC (Low Density Parity Check) decoder 47, and the SOVA parameter controller 49. The SOVA 46 decodes the output signal of the FIR filter 45 and sends the result to the LDPC decoder 47 as soft information.

The LDPC decoder 47 is connected to the SOVA 46. The LDPC decoder 47 performs processing of correcting errors in the input signal using low-density parity-check matrices based on the soft information that is the soft output result received from the SOVA 46.

The PLL 50 is connected to the ADC 44 and the FF variation calculation module 48. The error estimation amount of the PLL 50 is sent to the FF variation calculation module 48.

The FF variation calculation module 48 is connected to the AGC 41, the asymmetry correction module 42, the PLL 50, and the SOVA parameter controller 49. The FF variation calculation module 48 calculates the variation (to be referred to as a low latency calculation variation hereinafter) of the calculation result of the low latency processor necessary for adjusting the optimization parameters. The optimization parameters (also to be referred to as internal parameters) are parameters to be used for processing in the read channel. Examples of the optimization parameters are a signal average value, a noise variance, and/or the tap coefficients of a whitening filter and/or the like, which are used in branch metric calculation processing of the Viterbi decoder 46. The calculation result of the low latency processor correlates with the calculation result of the maximum likelihood decoder such as the correction amount feedback value of the AGC 41, the error estimation amount of the PLL 50, or the asymmetry correction amount result. The calculation result of the low latency processor has a value that can be fed forward to the maximum likelihood decoder in real time because of the low latency. The SOVA parameter controller 49 corrects the noise variance in the SOVA, the coefficients of the whitening filter, and/or the ideal value of the signal average value in accordance with, for example, the output values of the FF variation calculation module 48 and the FIR filter 45. More specifically, based on the low latency calculation variation, the SOVA parameter controller 49 calculates at least one optimization parameter using, for example, equations (1) to (4).

$$\text{ideal sample}(t) = \text{ideal sample}(t-1) \times |(1+(\text{VGA value}(t) - \text{VGA value}(t-1))/\text{VGA value}(t))| \quad (1)$$

$$\text{sigma}(t) = \text{sigma}(t-1) \times |(1+(\text{VGA value}(t) - \text{VGA value}(t-1))/\text{VGA value}(t))| \quad (2)$$

$$f1(t) = f1(t-1) \times |(1+(\text{VGA value}(t) - \text{VGA value}(t-1))/\text{VGA value}(t))| \quad (3)$$

$$f2(t) = f1(t-1) \times |(1+(\text{VGA value}(t) - \text{VGA value}(t-1))/\text{VGA value}(t))| \quad (4)$$

where t is the data sector number, ideal sample(t) is the ideal value of the signal average value corresponding to the tth data sector, sigma(t) is the noise variance contained in the input signal, $f1(t)$ is the first tap coefficient of the whitening filter for the tth data sector, and $f2(t)$ is the second tap coefficient of the whitening filter for the tth data sector. Note that the whitening filter is assumed to have three tap coefficients. VGA value(t) is the output value of the VGA for the tth data sector. Note that equations (1) to (4) are equations to be used to obtain the values of optimization parameters calculated based on the variation of the output value of the VGA. To calculate the optimization parameters using the asymmetry correction amount or the error estimation amount, VGA value (t) in equations (1) to (4) is replaced with the value of the asymmetry correction amount for the tth data sector or the value of the error estimation amount for the tth data sector. As described above, in the embodiment, the variation of the feedback value of the low latency processor such as the VGA circuit for a target (present) data sector is multiplied by the optimization parameter in the maximum likelihood decoder for to the immediately preceding (the previous) data sector, as indicated by equations (1) to (4). The optimization parameters can thus be adjusted (corrected) to more optimum values by following the variation of the signal or noise in real time.

The optimization parameters may be calculated using not the predetermined equations such as equations (1) to (4) using multiplication operations but addition operations such as $$\text{ideal sample}(t) = \text{ideal sample}(t-1) + (1+(\text{VGA value}(t) - \text{VGA value}(t-1))/\text{VGA value}(t)) \quad (5)$$

$$\text{sigma}(t) = \text{sigma}(t-1) + (1+(\text{VGA value}(t) - \text{VGA value}(t-1))/\text{VGA value}(t)) \quad (6)$$

$$f1(t) = f1(t-1) + (1+(\text{VGA value}(t) - \text{VGA value}(t-1))/\text{VGA value}(t)) \quad (7)$$

$$f2(t) = f1(t-1) + (1+(\text{VGA value}(t) - \text{VGA value}(t-1))/\text{VGA value}(t)) \quad (8)$$

A signal representing the low latency calculation variation calculated by the FF variation calculation module 48 is sent to the SOVA parameter controller 49.

The SOVA parameter controller 49 is connected to the FF variation calculation module 48 and the SOVA 46. Details of processing performed by the SOVA parameter controller 49 will be explained with reference to FIG. 3. The SOVA parameter controller 49 adjusts the optimization parameters based on the low latency calculation variations for the tth data sector as indicated by equations (1) to (4) or equations (5) to (8), which are calculated by the FF variation calculation module 48, and sends the adjusted optimization parameters to the SOVA 46.

The SOVA parameter controller 49 updates the optimization parameters for each data sector. For example, the SOVA parameter controller 49 may transmit a signal representing the updated optimization parameters to the SOVA 46 at a timing an identifier or the like to identify the data sector included in the FIR output result is received.

More detailed functions of the SOVA 46 will be described next with reference to FIG. 3.

The SOVA 46 comprises a whitening filter 53, a branch metric calculation module 54, and a read channel reconstruction module 55.

The whitening filter 53 performs processing of whitening the output signal of the FIR filter 45. The output signal of the whitening filter 53 is sent to the branch metric calculation module 54. The tap coefficients of the whitening filter 53 are determined based on the signal received from the SOVA parameter controller 49.

The branch metric calculation module 54 calculates a branch metric based on a signal S2, which received from the SOVA parameter controller 49 and representing a parameter to be used to calculate the branch metric, and based on a whitening filter output value $v_k$ received from the whitening filter 53. The branch metric is calculated by $$BM_k = \left(\frac{-1}{2\sigma^2}\right)\left(V_k - \sum_{n=0}^{L} f_n \times a_{k-n}\right)^2 \quad (9)$$

where k is the bit number of the received signal, $BM_k$ is the calculated branch metric value, $\sigma$ is the standard deviation of noise contained in the input signal, n is a tap coefficient of the whitening filter 53, L is the PR length, $f_n$ is a tap coefficient of the whitening filter 53, and $a_k$ is the received data sequence. "$\Sigma f_n \times a_{k-n}$" of equation (9) represents the ideal output sample value (the ideal value of the signal average value) of the whitening filter.

The signal S1 represents the first tap coefficient and the second tap coefficient which are corrected by the SOVA parameter controller 49. The signal S2 represents the sigma and represents the ideal value of the signal average value, which are corrected by the SOVA parameter controller 49.

The branch metric calculation module 54 outputs the calculated $BM_k$ to the LDPC decoder 47 and the read channel reconstruction module 55 as soft information.

The read channel reconstruction module 55 is connected to the branch metric calculation module 54 and the SOVA parameter controller 49. The read channel reconstruction module 55 may perform, based on the output result of the branch metric calculation module 54, processing necessary for, for example, applying the optimization parameters of the immediately preceding data sector to the optimization parameters to be used in the next data sector.

As described above, the SOVA parameter controller 49 controls the first parameter based on the output value of the FF variation calculation module 48. More specifically, based on the output value of the FF variation calculation module 48 and the output value of the FIR 45, the SOVA parameter controller 49 sends a signal S1 to the whitening filter 53 and sends the signal S2 to the branch metric calculation module 54. For example, the SOVA parameter controller 49 may detect the value of the FIR concerning the input signal of the first data sector and transmit the signals S1 and S2.

In the above description, the optimization parameters are calculated using equations (1) to (8). A modification will be explained below.

The SOVA parameter controller 49 may combine the value of an optimization parameter (optimization parameter calculated by equations (1) to (8)) for the first data sector already adjusted based on the output result of the FF variation calculation module 48 and the value of the optimization parameter (optimization parameter calculated by equations (1) to (8)) adjusted in the past for the second data sector and received from the read channel reconstruction module 55, for example, the optimization parameter adjusted for the preceding data sector, thereby correcting the optimization parameter for the first data sector. The optimization parameter for the second data sector may be calculated without using equations (1) to (8)). Alternatively, the SOVA parameter controller 49 may weight the optimization parameter for the first data sector and the optimization parameter for the second data sector at a predetermined ratio, then combining the weighted optimization parameters to calculate the optimization parameter for the first data sector. That is, for example, the Viterbi decoder as described above reflects the circuit operation of the Viterbi decoder itself before the read of the first data sector on the variation of the S/N ratio between the first data sector and the second data sector to be described later with reference to FIG. 4, thereby the Viterbi decoder adjusting the optimization parameters. In other words, the optimization parameters can be adjusted based on the past operation processing result.

The circuit to be used to calculate the branch metric need not always be a soft output Viterbi algorithm decoder such as the SOVA 46 but may be a decoder that performs, for example, hard decision processing.

A change in the value of the signal in the R/W channel 12 caused by a change in noise contained in the input signal will be described next with reference to FIG. 4.

Dotted lines 21 indicate the ideal inner and outer peripheral positions of a data track on the magnetic disk 1 on which write data is written. Solid lines 22 indicate the inner and outer peripheral positions of the data track on the magnetic disk 1 on which write data is actually written. An arrow 25 indicates the read direction on the data track. A read head position 10Ra represents the start position of the read head 10R on the magnetic disk 1 when the read is performed along the arrow 25. A read head position 10Rb represents the end position of the read head 10R on the magnetic disk 1 when the read is performed along the arrow 25. Reference numeral 23 indicates the ratio of a signal contained in the input signal to noise (S/N ratio). Reference numeral 24 indicates the value of the processing signal in the R/W channel 12, for example, the feedback value of the VGA 41a.

The magnetic disk apparatus has data sectors continuously arranged in one track, and should ideally be designed to eliminate the characteristic difference between the data sectors. However, write data is not necessarily written in the area sandwiched between the dotted lines 21 and may be written in the area sandwiched between the solid lines 22. More specifically, the solid lines 22 undulate as compared to the dotted lines 21, as shown in FIG. 4. For example, in a data sector 26 (second data sector), the solid lines 22 are shifted to the upper side of the dotted lines 21 in FIG. 4. That is, in this case, the write data is written at a position shifted from the ideal write data track area to the upper side in FIG. 4. On the other hand, in a data sector 27 (first data sector), the solid lines 22 are shifted to the lower side of the dotted lines 21 in FIG. 4. That is, in this case, the write data is written at a position shifted from the ideal write data track area to the lower side in FIG. 4.

As described above, the area where the write data is actually written is different from the ideal area. For this reason, the read head 10R sometimes obtains an input signal containing noise upon reading a certain data sector.

Figure 4:
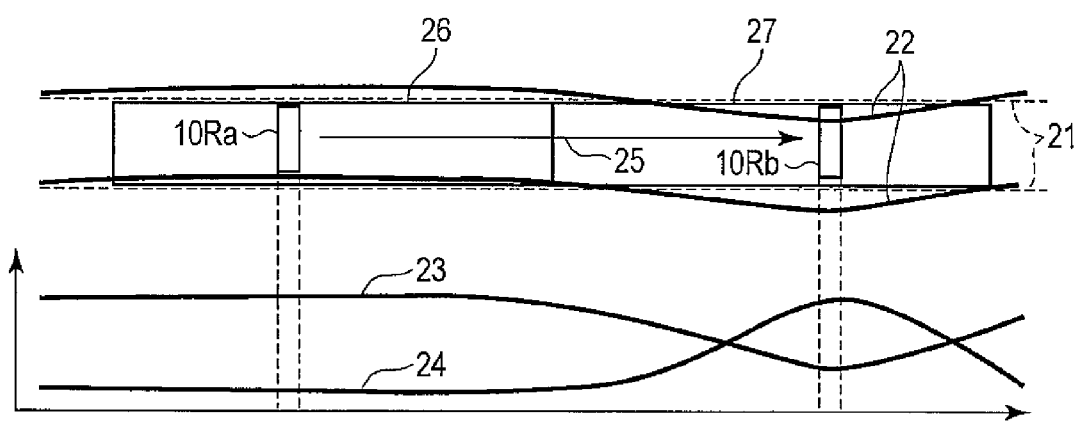
FIG. 4 is an exemplary view showing an outline of read processing by the magnetic disk apparatus according to the embodiment.

For example, assume that the read head position 10Ra corresponds to the position of the second data sector on the magnetic disk 1, and the read head position 10Rb corresponds to the position of the first data sector on the magnetic disk 1 in FIG. 4. The second data sector is assumed to be adjacent to the first data sector. In this case, the S/N ratio in the first data sector, which is indicated by reference numeral 23, is lower than that in the second data sector, as can be seen from FIG. 4.

As described above, when the read head 10R moves along the arrow 25, the S/N ratio sometimes changes because the write data is written with undulation with respect to the ideal area. The undulation of the write data as shown in FIG. 4 is caused by degradation of the servo positioning accuracy upon write. As is apparent from FIG. 4, when the S/N ratio lowers, the feedback value of the VGA 41a increases accordingly. The S/N ratio varies due to the influence of noise from the adjacent track. For example, assume that the write head 10W writes data in the area indicated by the solid lines 22 upon write. In this case, when the read head 10R reads the written data along the arrow 25 upon read, noise may be received from adjacent tracks, for example, tracks adjacent to the track including the data sectors 26 and 27.

The outline of updating the optimization parameters in the embodiment will be described next with reference to FIG. 5.

Figure 5:
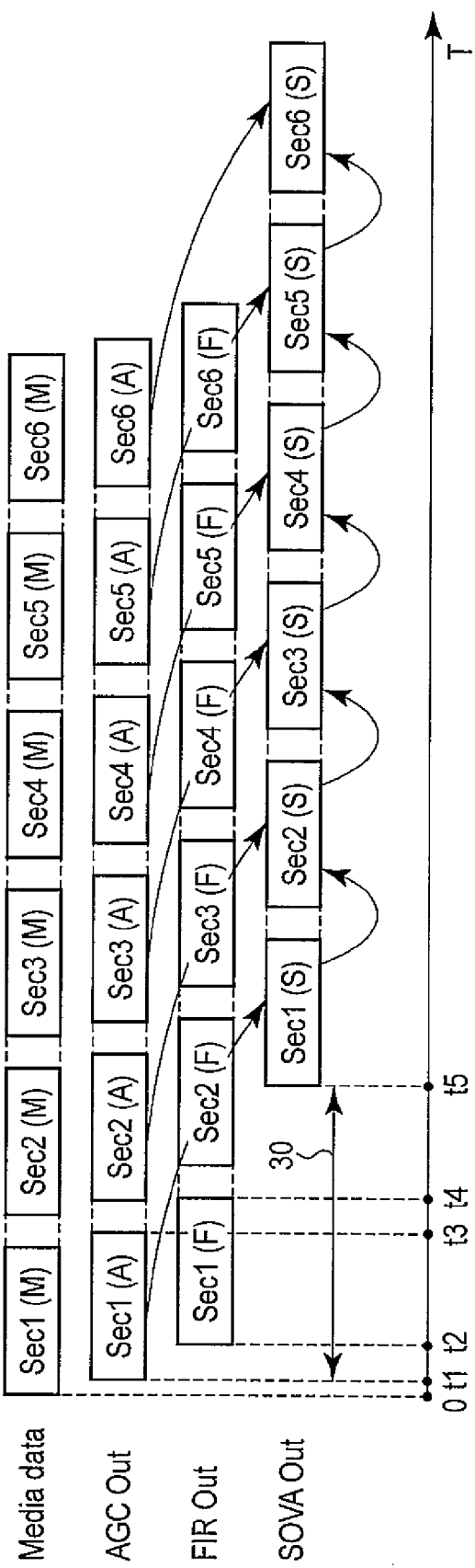
FIG. 5 is an exemplary view showing an outline of the optimization parameter updating by the magnetic disk apparatus according to the embodiment.

FIG. 5 assumes a case in which a plurality of continuous data sectors of a data track are sequentially read. In FIG. 5, the plurality of continuous data sectors are represented by six data sectors (Sec1(M) to Sec6(M)). Sec1(M) to Sec6(M) are sequentially read from Sec1(M) to Sec6(M). The left end of Sec1(M) is defined as time T=0. That is, processing of reading the first data sector Sec1(M) starts at time T=0.

The AGC 41 that is one of the signal processing circuits in the read channel will be exemplified next. For example, the left end of each of Sec1(A) to Sec6(A) indicates the position on the time axis where the output result of the AGC 41 in the read channel is obtained for a corresponding one of Sec1(M) to Sec6(M). For example, the left end of Sec1(A) is defined as time T=t1. Sec1(A) indicates the position on the time axis where the output result of the AGC 41 is obtained for Sec1(M). This means that the output result of the AGC 41 can be obtained after the time t1 has elapsed from the start of read processing at time T=0. This also means that, for example, the output result of the AGC 41 for the read data finally read in Sec1(M) can be obtained at time T=t3.

Each of Sec1(F) to Sec6(F) indicates the position on the time axis where the output result of the FIR filter 45 in the read channel is obtained for a corresponding one of Sec1(M) to Sec6(M). Each of Sec1(S) to Sec6(S) indicates the position on the time axis where the output result of the SOVA 46 in the read channel is obtained for a corresponding one of Sec1(M) to Sec6(M). For example, at time T=t2, the output result of the FIR filter 45 can be obtained for the read data written at the start of Sec1(M). At time T=t4, the output result of the FIR filter 45 can be obtained for the read data finally read in Sec1(M).

Reference numeral 30 indicates latency that is the time from the timing the output result of the AGC 41 is acquired to the timing the output result of the SOVA 46 is acquired. More specifically, the output result of the AGC 41 for Sec1(M) is acquired at time T=t1, and the output result of the SOVA 46 corresponding to that output result is acquired at time T=t5.

In the embodiment, the optimization parameters are adjusted based on the processing results of the same data sector. The optimization parameters are adjusted by estimating the noise amount for the data sector under Viterbi decoding before the Viterbi decoding is executed by the Viterbi decoder, thereby executing maximum likelihood decoding.

More specifically, when the same data sector is Sec1 in FIG. 5, the arrow from Sec1(A) to Sec1(S) indicates that the optimization parameters in the SOVA 46 for Sec1(M) are adjusted based on the output result of the AGC 41 for Sec1(M).

On the other hand, the arrow from Sec1(S) to Sec2(S) indicates that the optimization parameters in the SOVA 46 for Sec2(M) are adjusted based on the output result of the SOVA 46 for Sec1(M). For example, the optimization parameters for Sec2(M) may be adjusted based on the output result of the SOVA 46 for Sec1(M) indicated by the arrow from Sec1(S) and the output result of the AGC 41 for Sec2(M) indicated by the arrow from Sec2(A).

The embodiment uses the calculation result, for the same data sector, of a circuit different from the SOVA 46. For this reason, a processing circuit (to be referred to as the low latency processing circuit as described above) for the same data sector, which has a latency lower than that of the SOVA 46, is necessary. The above description assumes that the low latency processing circuit is the AGC 41. In the embodiment, as shown in FIG. 5, the low latency means that a latency of the AGC 41 for the input signal input in T=0 is lower than a latency of the SOVA 46 for the input signal. The fact that the AGC 41 has the low latency as compared to the SOVA 46 may be equivalent to the fact that the value in time T=t3 is smaller than the value in time T=t5 in FIG. 5.

As described above with reference to FIG. 5, in the embodiment, the output result of the AGC 41 or the like, which has a low latency, is fed forward to the SOVA 46 whose latency is longer than that of the AGC 41 or the like in each of the data sectors. It can be thus predicted that the variation of the S/N ratio and adjust (correct) the optimization parameters of the SOVA 46. Hence, maximum likelihood decoding for the first data sector can be executed in real time using the adjusted (corrected) optimization parameters.

Figure 6:
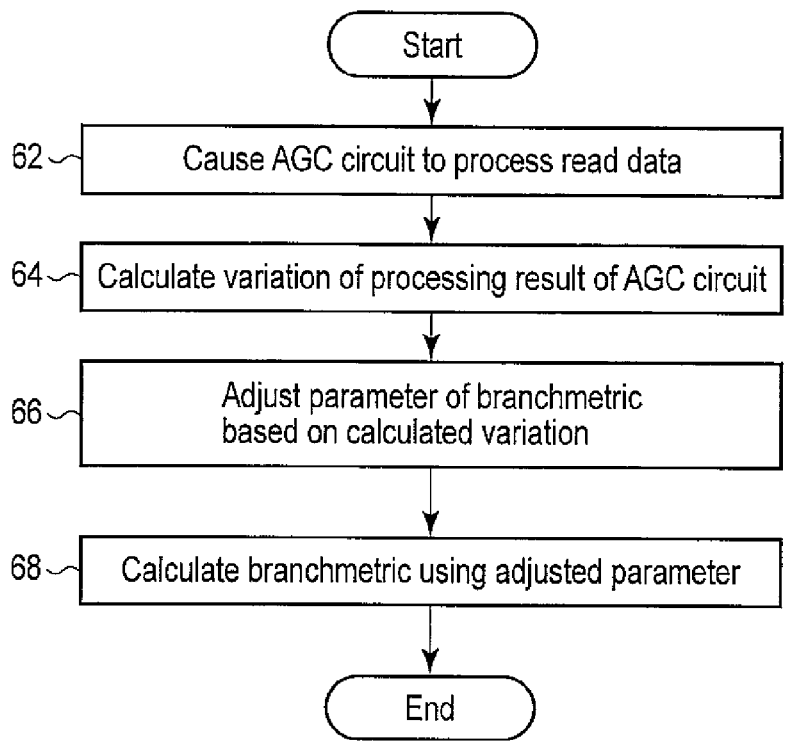
FIG. 6 is an exemplary flowchart for explaining a procedure of branch metric calculation processing to be executed by the read channel of the magnetic disk apparatus according to the embodiment.

An example of the procedure of processing of calculating a branch metric will be described next with reference to FIG. 6.

In a block 62, the AGC 41 performs processing for read data. For example, the AGC 41 performs gain control processing for controlling the gain based on the output result of the preamplifier 40. The gain control processing is processing of, for example, causing the VGA 41a to maintain a predetermined voltage value of the output signal to be output to the ASYM 42.

In a block 64, the FF variation calculation module 48 calculates the variation of the processing result of the AGC 41. The variation of the processing result of the AGC 41 is, for example, the variation of the output value of the VGA.

In a block 66, the SOVA parameter controller 49 adjusts the parameters of the branch metric based on the variation calculated by the FF variation calculation module 48.

In a block 68, the branch metric calculation module 54 calculates a branch metric using the parameters adjusted by the SOVA parameter controller 49.

An example of the correlation between a branch metric calculation result and the low latency processing circuit will be described finally with reference to FIG. 7.

Figure 7:
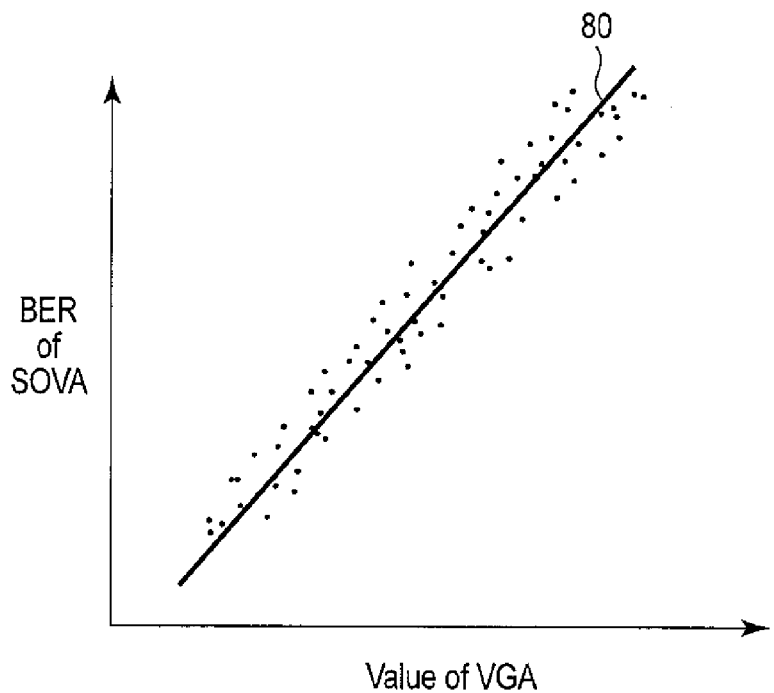
FIG. 7 is an exemplary graph showing a correlation between a calculation result by the SOVA and a processing result of a low latency processing circuit of the magnetic disk apparatus according to the embodiment.

FIG. 7 shows an example of the correlation between a branch metric calculation result and the processing result for the low latency processing circuit. FIG. 7 is a distribution map showing the correlation between the BER (Bit Error Rate) of the output result of the SOVA 46 and the output value of the VGA 41a in the AGC 41. The BER of the SOVA 46 and the output value of the VGA 41a hold, for example, a proportional relationship indicated by a line 80 so that the BER of the SOVA 46 and the output value of the VGA 41a have a correlation.

Note that the correlation need not be limited to the proportional relationship as shown in FIG. 7. For example, the value of the branch metric calculation result and the value of the calculation result of the low latency processing circuit need only have regularity necessary for predicting the variation of the value of the calculation result of the low latency processing circuit and the variation of the value of the branch metric calculation result.

As described above, according to this embodiment, the optimization parameters of the maximum likelihood decoder to be used for maximum likelihood decoding in the read channel of the magnetic disk apparatus are updated (real-time optimization automatic follow-up adjustment) based on the S/N ratio of the data sector itself under the read. This improves the maximum likelihood decoding performance and the accuracy of soft information output from the maximum likelihood decoder. Hence, the correction capability of the LDPC decoder using the soft information output from the maximum likelihood decoder also improves. That is, the sequential read performance is also expected to improve. More specifically, even when the S/N ratio varies between data sectors, no mismatch occurs between the optimization parameters and the S/N ratio conditions because the optimization parameters can be adjusted in accordance with the variation of the S/N ratio under the original noise condition, that is, in the same data sector as that under the maximum likelihood decoding. The optimization parameters are adjusted based on the output result that highly correlates with the soft information that is the output result of the Viterbi decoder. Hence, the optimization parameters can be adjusted based on one of the plurality of output results. When optimizing the internal parameters, the operation result of a signal processing circuit having a low latency for a read target data sector is used as the correction amount, thereby adjusting the optimization parameters in real time. Furthermore, maximum likelihood decoding of the read target data sector can be executed in real time in a state in which the internal parameters have values following the noise amount in the read target data sector before the start of the maximum likelihood decoding of the read target sector.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal processing apparatus to receive an input signal and to output a first processing result, the signal processing apparatus comprising:
a Viterbi decoder configured to calculate a branch metric based on the input signal and a first parameter;
a processor comprising at least one of an automatic gain control circuit, a phase locked loop, and an asymmetry correction circuit and configured to output a second processing result based on the input signal, the input signal being supplied to the Viterbi decoder through the processor, and the second processing result being correlated with the first processing result, wherein a latency of the processor is lower than a latency of the Viterbi decoder; and
an adjuster configured to adjust the first parameter for the Viterbi decoder based on the second processing result and to supply the adjusted first parameter to the Viterbi decoder,
wherein the second processing result comprises at least one of:
a gain correction amount of the automatic gain control circuit,
an error estimation amount of the phase locked loop, and
an asymmetry correction amount of the asymmetry correction circuit, and
the adjuster is further configured to
adjust the first parameter for data sectors comprising encoded data,
adjust a second parameter for calculating the branch metric before the branch metric is calculated for a first data sector of the data sectors, and
adjust the first parameter for the first data sector based on the second processing result.

2. The apparatus of claim 1, wherein the adjuster is further configured to
weight a value of the first parameter and a value of the second parameter with a ratio, and
based on the weighted values of first and second parameters, calculate a third parameter for calculating the branch metric.

3. The apparatus of claim 1, wherein the adjuster is further configured to adjust, as the first parameter,
a variance of noise in the input signal,
an ideal output value of a whitening filter in the Viterbi decoder, or
a tap coefficient of the whitening filter.

4. The apparatus of claim 1,
wherein the adjuster is further configured to adjust the first parameter based on a variation of the gain correction amount, the error estimation amount, or the asymmetry correction amount.

5. A signal processing method of a signal processing apparatus to receive an input signal and to output a first processing result, the method comprising:
calculating, by a Viterbi decoder, a branch metric based on the input signal and a first parameter;
outputting, by a processor comprising at least one of the automatic gain control circuit, the phase locked loop, and the asymmetry correction circuit, a second processing result based on the input signal, the input signal being supplied to the Viterbi decoder through the processor, and the second processing result being correlated with the first processing result, wherein a latency of the processor is lower than a latency of the Viterbi decoder;
adjusting the first parameter for the Viterbi decoder based on the second processing result; and
supplying the adjusted first parameter to the Viterbi decoder,
wherein the second processing result comprises at least one of:
a gain correction amount of the automatic gain control circuit, an error estimation amount of the phase locked loop, and
an asymmetry correction amount of the asymmetry correction circuit, and the adjusting comprises:

adjusting the first parameter for data sectors comprising encoded data, adjusting a second parameter for calculating the branch metric before the branch metric is calculated for a first data sector of the data sectors, and adjusting the first parameter for the first data sector based on the second processing result.

6. The method of claim 5, wherein adjusting comprises weighting a value of the first parameter and a value of the second parameter with a ratio, and based on the weighted values of the first and second parameters, calculating a third parameter for calculating the branch metric.

7. The method of claim 5, wherein adjusting comprises adjusting, as the first parameter, a variance of noise in the input signal, an ideal output value of a whitening filter in the Viterbi decoder, or a tap coefficient of the whitening filter.

8. The method of claim 5, wherein the adjusting comprises adjusting the first parameter based on a variation of the gain correction amount, the error estimation amount, or the asymmetry correction amount.

9. A magnetic disk apparatus comprising:

a read head configured to read data written on a magnetic disk and to output a read signal;

a Viterbi decoder configured to calculate a branch metric based on the read signal from the data read by the read head and a first parameter;

a processor comprising at least one of an automatic gain control circuit, a chase locked loop, and an asymmetry correction circuit and configured to output a processing result based on the read signal, the read signal being supplied to the Viterbi decoder through the processor, wherein a latency of the processor is lower than a latency of the Viterbi decoder; and an adjuster configured to adjust the first parameter for the Viterbi decoder based on the processing result and to supply the adjusted first parameter to the Viterbi decoder, wherein the processing result comprises at least one of:

a gain correction amount of the automatic gain control circuit, an error estimation amount of the phase locked loop, and an asymmetry correction amount of the asymmetry correction circuit, and the adjuster is further configured to adjust the first parameter for data sectors comprising encoded data, adjust a second parameter for calculating the branch metric before the branch metric is calculated for a first data sector of the data sectors, and adjust the first parameter for the first data sector based on the processing result.

10. The apparatus of claim 9, wherein the adjuster is further configured to weight a value of the first parameter and a value of the second parameter with a ratio, and based on the weighted values of the first and second parameters, calculate a third parameter for calculating the branch metric.

11. The apparatus of claim 9, wherein the adjuster is further configured to adjust, as the first parameter, a variance of noise in the input signal, an ideal output value of a whitening filter in the Viterbi decoder, or a tap coefficient of the whitening filter.

12. The apparatus of claim 9, wherein the adjuster is further configured to adjust the first parameter based on a variation of the gain correction amount, the error estimation amount, or the asymmetry correction amount.

* * * * *